United States Patent
Germann et al.

(10) Patent No.: US 7,326,857 B2
(45) Date of Patent: Feb. 5, 2008

(54) METHOD AND STRUCTURE FOR CREATING PRINTED CIRCUIT BOARDS WITH STEPPED THICKNESS

(75) Inventors: Philip Raymond Germann, Oronoco, MN (US); Mark James Jeanson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 212 days.

(21) Appl. No.: 10/992,399

(22) Filed: Nov. 18, 2004

(65) Prior Publication Data

US 2006/0101638 A1  May 18, 2006

(51) Int. Cl.
*H05K 1/03* (2006.01)
(52) U.S. Cl. .................. 174/255; 174/254; 174/260
(58) Field of Classification Search ............ 174/255; 361/792, 793, 794, 795
See application file for complete search history.

(56) References Cited

U.S. PATENT DOCUMENTS

| | | | | |
|---|---|---|---|---|
| 4,862,323 A * | 8/1989 | Butt | ............ | 361/708 |
| 5,144,534 A * | 9/1992 | Kober | ............ | 361/751 |
| 5,303,121 A * | 4/1994 | Thornberg | ............ | 361/760 |
| 6,316,732 B1 * | 11/2001 | Lim | ............ | 174/255 |
| 6,582,989 B2 * | 6/2003 | Biegelsen et al. | ............ | 438/106 |
| 7,036,214 B2 * | 5/2006 | Kondo et al. | ............ | 29/830 |
| 2001/0054481 A1 * | 12/2001 | Harada et al. | ............ | 156/289 |
| 2004/0070959 A1 * | 4/2004 | Sakai | ............ | 361/792 |
| 2005/0001785 A1 * | 1/2005 | Ferguson et al. | ............ | 343/895 |

* cited by examiner

*Primary Examiner*—Ishwar (I. B.) Patel
(74) *Attorney, Agent, or Firm*—Joan Pennington (57) ABSTRACT

A method and structure are provided for creating printed circuit boards with stepped thickness. A non-laminating breakaway material layer is selectively placed between layers of the printed circuit board. A perimeter portion of the printed circuit board near the breakaway material layer is scored. Then the breakaway material layer and adjacent layers between the perimeter of the printed circuit board are removed.

6 Claims, 7 Drawing Sheets

METHOD AND STRUCTURE FOR CREATING PRINTED CIRCUIT BOARDS WITH STEPPED THICKNESS

FIELD OF THE INVENTION

The present invention relates generally to the data processing field, and more particularly, relates to a method and structure for creating printed circuit board with stepped thickness.

DESCRIPTION OF THE RELATED ART

Printed circuit board (PCB) manufacturers have found that there are difficulties in manufacturing a stepped-thickness PCB structure.

For example, PCB manufacturers can create multilayer circuit boards with cavities or stepped layer constructs by routing away excess material on outer layers or cavity routing for creating a thinner package in the routed area.

Problems with cavity routing include card warpage during and after routing and the risk of cutting into conductors on the layer to be exposed. These difficulties prevent manufacturers from offering PCBs featured with stepped thickness, and thus prevent the industry from taking advantage of this unique packaging opportunity.

A need exists for a method of creating stepped PCB thicknesses without these disadvantages.

SUMMARY OF THE INVENTION

A principal aspect of the present invention is to provide a method and structure for creating printed circuit boards with stepped thickness. Other important aspects of the present invention are to provide such method and structure for creating printed circuit boards with stepped thickness substantially without negative effect and that overcome many of the disadvantages of prior art arrangements.

In brief, a method and structure are provided for creating printed circuit boards with stepped thickness. A non-laminating breakaway material layer is selectively placed between layers of the printed circuit board. A perimeter portion of the printed circuit board near the breakaway material layer is scored. Then the breakaway material layer and adjacent perimeter portion layers of the printed circuit board are removed.

In accordance with features of the invention, the excess material in the selected portion of the printed circuit board for having a different thickness is easily detached without warping the board and without risk to the underlying conductors. The placement of the non-laminating breakaway material in areas where thickness change is desired is relatively simple to implement, since conventional PCB lamination techniques are used. PCB cores or multiple PCB layers are separately fabricated and circuitized as is conventionally done, and then laminated together with proper registration of the layers as they are laminated to insure correct positioning of each non-laminating breakaway material layer.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the process and structure in accordance with features of the preferred embodiments, a printed circuit board (PCB) is circuitized and laminated in the same process as a conventional circuit board. A significant difference in accordance with the preferred embodiments lies in using a layer of non-laminate breakaway material between layers where a thickness difference is desired. Placing the non-laminating material between the layers prevents adhesion between the adjacent layers. Following lamination, the selected area for having a different thickness advantageously is scored along a perimeter, rather than routed away, and the excess material is easily detached without warping the board and without risk to the underlying conductors.

Figure 1:
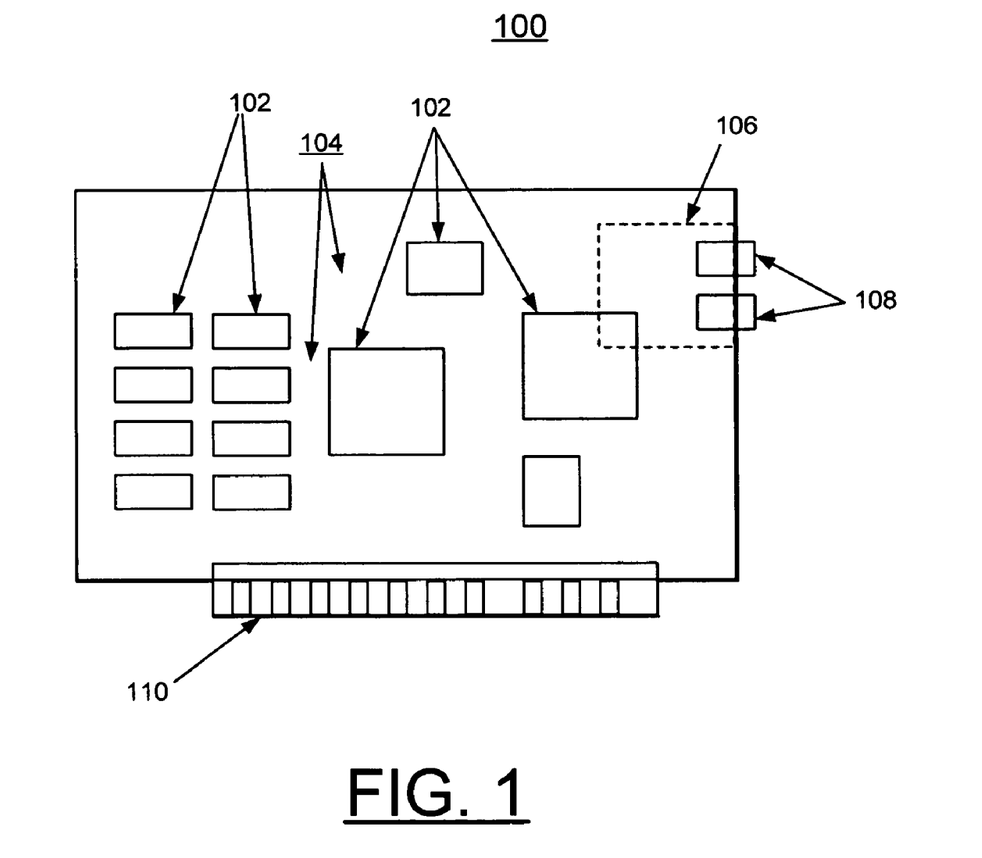
FIGS. 1 and 2 illustrate exemplary printed circuit boards with stepped thickness in accordance with the preferred embodiment.

Having reference now to the drawings, in FIG. 1, there is shown an exemplary printed circuit board (PCB) with stepped thickness generally designated by the reference character 100 in accordance with the preferred embodiment. Stepped thickness PCB 100 is formed by a novel process which uses existing lamination and PCB technology to create a stepped PCB thickness.

A plurality objects generally designated 102 representing components such as BGA modules, and the like are included within a respective selected area 104 of the stepped thickness PCB 100. Stepped thickness PCB 100 includes a plurality of the selected areas 104 of dense wiring having more layers than a pair of adjacent areas generally designated 106, 110. The areas 104 can be thicker, for example, containing more wiring layers for densely placed components. Stepped thickness PCB 100 includes an area 106 indicated in dotted line adjacent a pair of tailstock connectors 108. Area 106, for example, containing high-impedance signals, includes thicker layers of dielectrics. Stepped thickness PCB 100 includes an edge connector 110.

Figure 2:
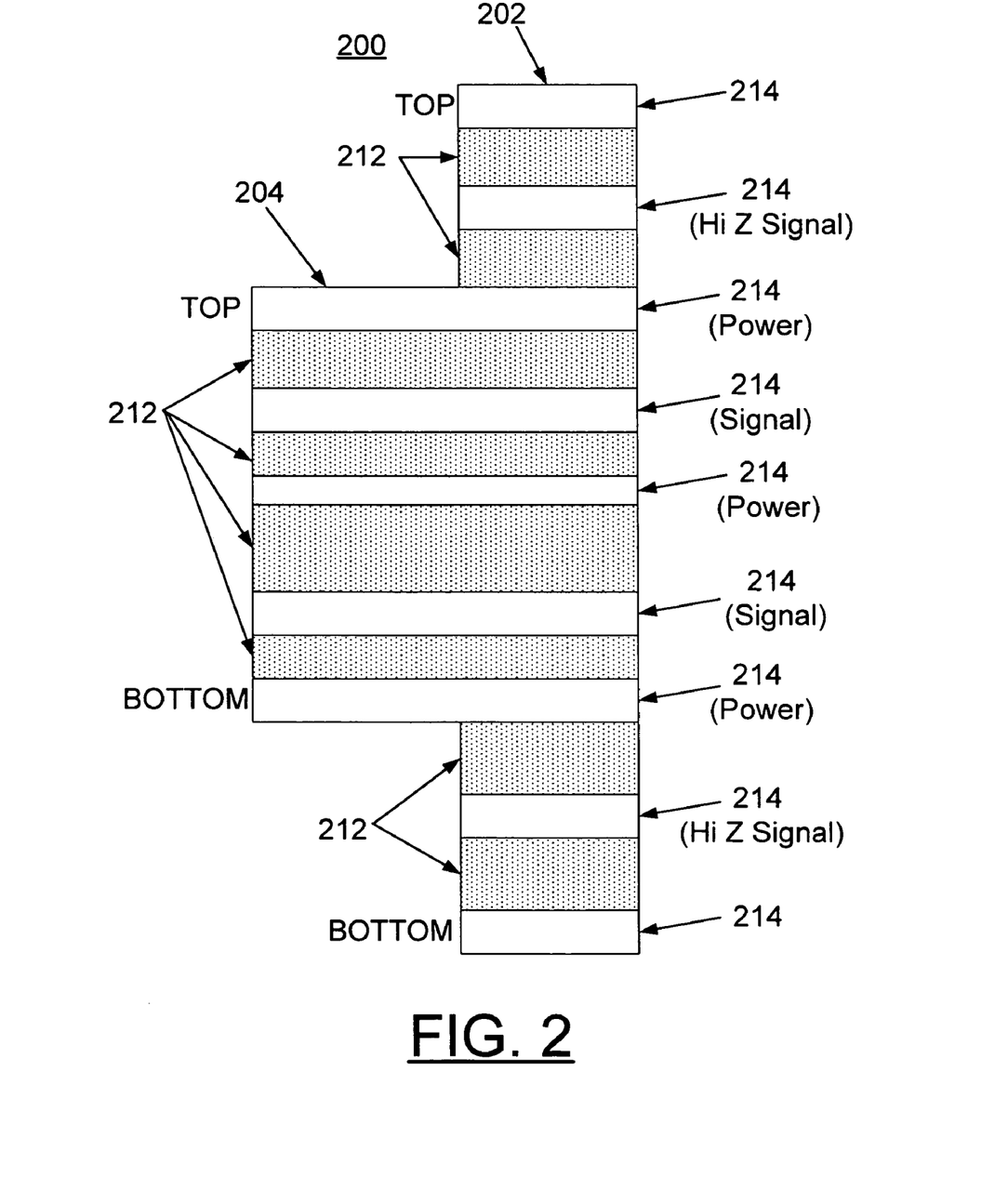

In FIG. 2, there is shown another exemplary stepped thickness PCB generally designated by the reference character 200 in accordance with the preferred embodiment. The cross sectional view shows only a pair of different stackup constructs 202, 204, each including a plurality of dielectric layers 212 and a plurality of wiring layers 214. It should be understood that multiple such constructs could be used to have mulitple card thicknesses in order to accommodate differing design requirements. For example, a connector area could be PCI standard, while areas needing mechanical retention could be of a different thickness, and areas of dense critical wiring could have yet another thickness. In another example based on FIG. 2, the outer signal planes 214 of construct 202 can contain thicker dielectric layers 212 as shown, resulting in higher impedance, as required by a particular application, such as SCSI, Ethernet, or the like.

Figure 3:
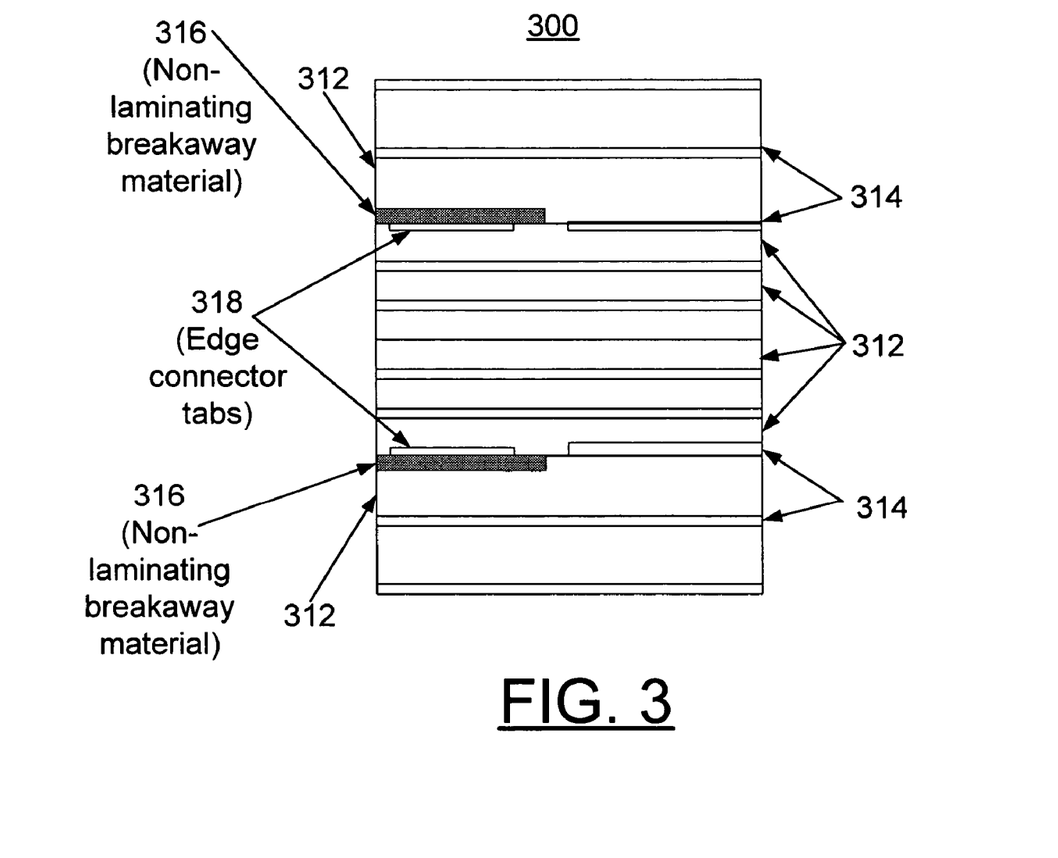
FIGS. 3, 4, and 5 illustrate exemplary structure and operations for creating printed circuit boards with stepped thickness in accordance with the preferred embodiment.
Figure 4:
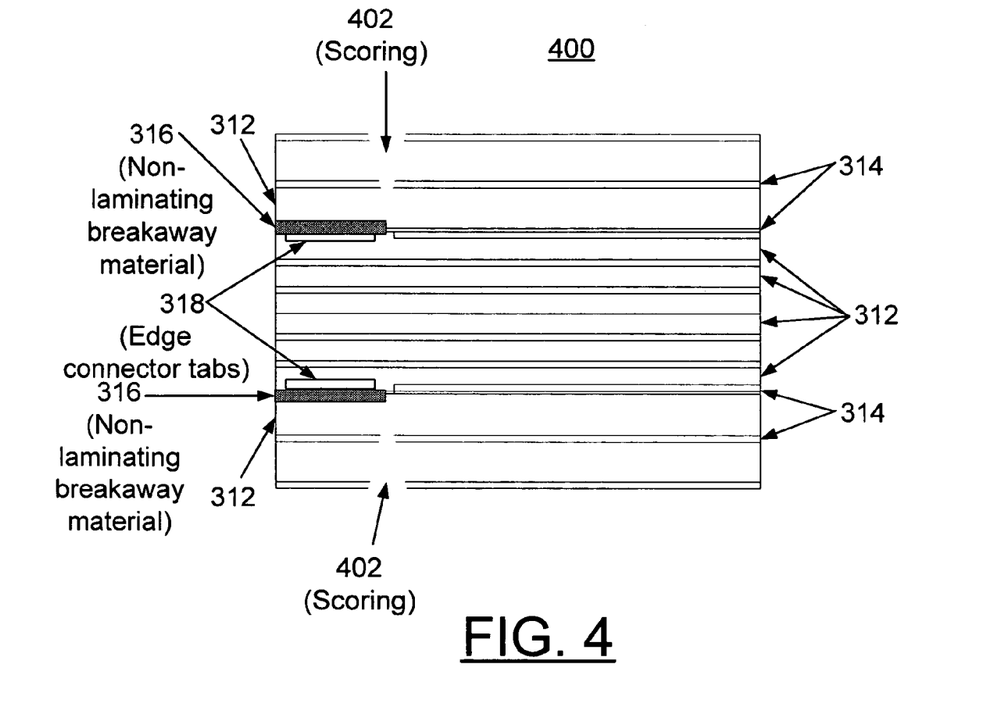
Figure 5:
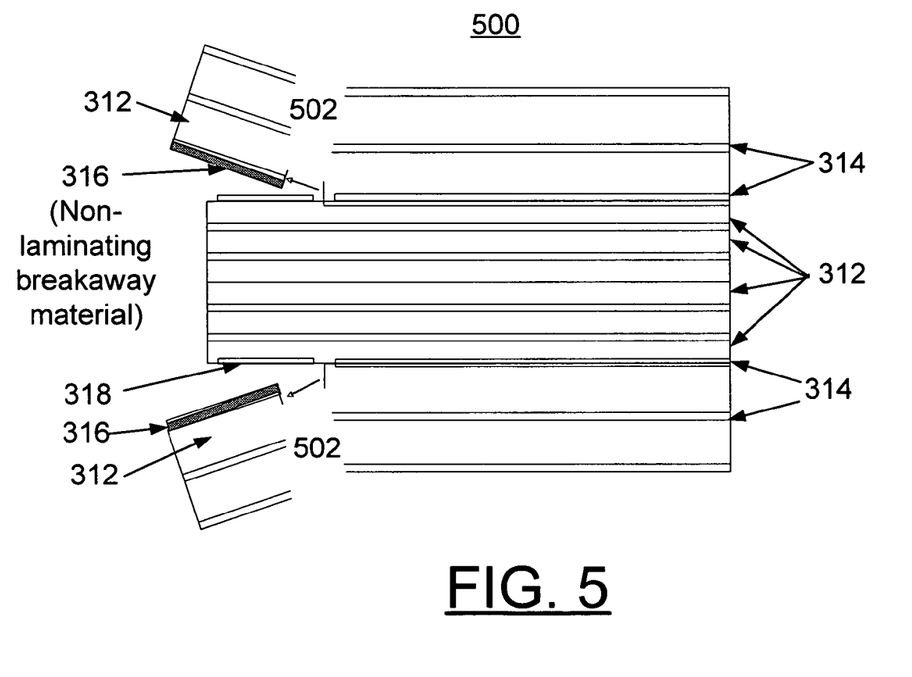
Figure 6:
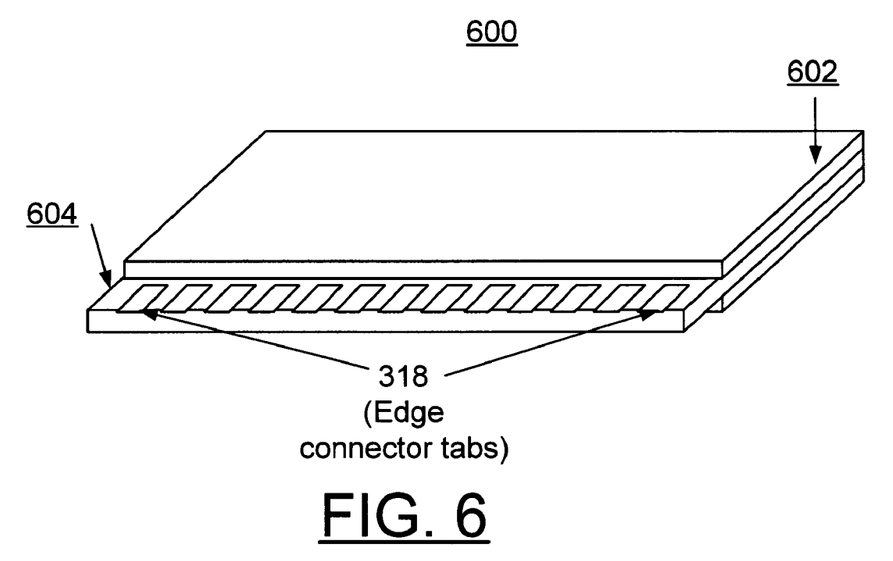
FIG. 6 illustrates an exemplary printed circuit board with stepped thickness following the removal of excess material in accordance with a method of the preferred embodiment.

FIGS. 3, 4, and 5 illustrate exemplary structure and operations respectively generally designated by reference characters 300, 400, and 500 for creating printed circuit boards with stepped thickness in accordance with the preferred embodiment. FIG. 6 illustrates an exemplary printed circuit board with stepped thickness generally designated by reference character 600 following the removal of excess material in accordance with a method of the preferred embodiment.

For example, FIGS. 3-6 show an exemplary embodiment with cross sections based on the stepped thickness PCB 200 shown in FIG. 2, with the excess material laminated to the overall thickness, then scored and removed to reveal the final stepped-thickness PCB 600. Because the scoring does not encroach on an internal circuitized layer, the internal circuitized layer is protected from damage, and a less precise tool can be used to score than is required to rout out the cavity in prior art arrangements.

FIG. 3 shows an exemplary PCB build-up 300 using the invention before scoring and removal of excess material. PCB build-up 300 includes a plurality of standard dielectric layers 312 and a plurality of copper planes and etch layers 314. A respective one of a pair of layers 316 of non-laminating breakaway material is placed between a respective edge connector tab 318 and respective dielectric layers 312. The non-laminating material layer 316 between the layers 312, 318 prevents adhesion between the adjacent layers.

The placement of the non-laminating breakaway material in areas where thickness change is desired is relatively simple to implement, since lamination techniques currently employed by PCB manufacturers are used. The PCB manufacturer simply needs to fabricate and circuitize PCB cores separately as is currently done, and then laminate them together. Current fabrication techniques, including the registration of the layers as they are laminated, are adequate to insure that the layers are placed properly.

A selected composition of the non-laminating breakaway material depends upon the dielectric material used in the package. For typical glass fiber dielectrics, a teflon barrier such as Kapton tape can be used. For boards of other materials, teflon or ceramic dielectric, for instance, other barriers such as glass-based or titanium-based films, respectively, can be used for the non-laminating breakaway material. FIG. 4 illustrates a next process step with an exemplary PCB build-up 400 including a scoring operation indicated by 402 to aid in removal of excess material.

FIG. 5 illustrates a next process step with an exemplary PCB build-up 500 including a material removal operation indicated by 502 to remove excess material following the scoring operation 402.

FIG. 6 illustrates an exemplary final stepped thickness PCB 600 following the material removal operation 502 with the edge connector tabs 318 exposed. Stepped thickness PCB 600 includes a first area 602 of more layers than an adjacent area generally designated 604 proximate to an edge connector.

Figure 7:
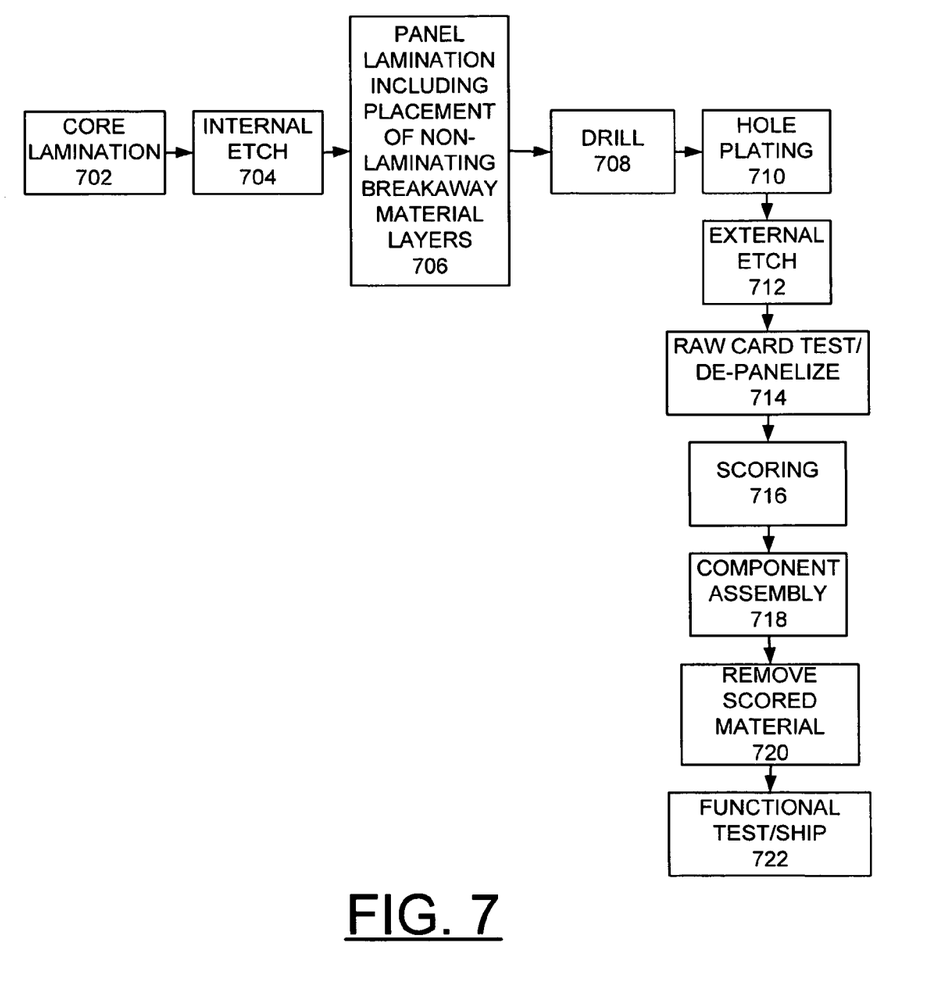
FIG. 7 illustrates exemplary manufacturing processing steps for implementing printed circuit boards with stepped thickness in accordance with the preferred embodiment.

FIG. 7 illustrates exemplary manufacturing processing steps for implementing printed circuit boards with stepped thickness in accordance with the preferred embodiment.

In accordance with features of the preferred embodiments, the process of the invention is an improvement over current methods for creating multi-thickness PCBs. In conventional processes, the excess material is routed out during the drill process, while the card is still panelized. Because all the layers are laminated together, this conventional process causes stresses on the card which lead to warping when the card is removed from the panel by another routing process, and when the card is exposed to high temperature assembly processes, such as solder reflow. The process of the invention places a non-laminating material between the PCB layers, and does not actually remove the excess material until the card has been removed from the panel and completely assembled. The process of the invention allows a more uniform thermal distribution for assembly, and protects the underlying circuitized internal conductors which will be exposed after assembly.

Referring to FIG. 7, first a core lamination is formed as indicated in a block 702. Next an internal etch as indicated in a block 704 and a panel lamination process is provided that includes placing selected layers of non-laminating material between layers where thickness difference is desired in accordance with the preferred embodiment as indicated in a block 706. Next a drilling step is performed as indicated in a block 708, eliminating the prior art cavity routing operations to create a thinner package in the routed area. Next conventional manufacturing processing steps are performed including hole plating at block 710, external etch at block 712, and raw card test and de-panelize at block 714. A scoring process in accordance with the preferred embodiment is provided to place scoring along a perimeter portion of the PCB construct near the non-laminating breakaway material as indicated in a block 716. Then conventional component assembly is performed as indicated in a block 718. Next the scored, excess material is removed including all the breakaway material layers and adjacent layers between each breakaway material layer and the perimeter of the PCB as indicated in a block 720. Then as indicated in a block 722, a functional test and product shipment are performed.

In brief, advantages and features of the preferred embodiments include 1) the ability to optimize electrical performance for high-speed interfaces in mechanically-constrained areas, for example, PCI-slots; 2) the ability to locally maximize wirability in areas where more layers are needed, and hence overall card function, and 3) the ability to utilize a broader array of mechanical retention on PCBs as a result of having more card thickness options available. The method to create a stepped thickness PCB of the preferred embodiment has the following advantages over conventional cavity routing processes: the present method does not create card warpage, and the present method does not place circuitized internal conductors at risk.

While the present invention has been described with reference to the details of the embodiments of the invention shown in the drawing, these details are not intended to limit the scope of the invention as claimed in the appended claims.

What is claimed is:

1. A structure for creating a printed circuit board with stepped thickness comprising:
 a plurality of core layers;
 a plurality of wiring layers respectively supported by said plurality of core layers;
 said plurality of core layers being laminated together for forming the printed circuit board;
 at least one reduced thickness area of the printed circuit board; said at least one reduced thickness area disposed adjacent a perimeter portion of the printed circuit board, said at least one reduced thickness area defining an edge connector including a plurality of edge connector electrically conductive tabs carried on predefined layers of said plurality of core layers;

a plurality of components being assembled on the printed circuit board; and said at least one reduced thickness area being formed using a non-laminating breakaway material layer selectively positioned between predefined layers of said plurality of core layers and spaced apart from said predefined wiring layers supported by said predefined layers of said plurality of core layers and removed to define said at least one reduced thickness area and said edge connector including said plurality of edge connector electrically conductive tabs; said non-laminating breakaway material layer preventing adhesion between a respective adjacent portion of said predefined layers of said plurality of core layers and said plurality of edge connector electrically conductive tabs.

2. A structure for creating a printed circuit board with stepped thickness as recited in claim 1 wherein said at least one reduced thickness area being formed using said non-laminating breakaway material layer includes at least one adjacent layer is removed by scoring a perimeter portion of the printed circuit board near the breakaway material layer.

3. A structure for creating a printed circuit board with stepped thickness as recited in claim 1 wherein said non-laminating breakaway material layer includes a layer formed of a glass-based material.

4. A structure for creating a printed circuit board with stepped thickness as recited in claim 1 wherein said non-laminating breakaway material layer includes a layer formed of a titanium-based material.

5. A structure for creating a printed circuit board with stepped thickness as recited in claim 1 wherein said non-laminating breakaway material layer includes a layer formed of a Teflon material, said Teflon material is polytetrafluoroethylene (PTFE).

6. A structure for creating a printed circuit board with stepped thickness as recited in claim 1 wherein said non-laminating breakaway material layer includes a layer formed of a ceramic dielectric material.

* * * * *